Aug. 13, 1968 W. KRIEGLSTEIN 3,397,084

METHOD FOR PRODUCING SUPERCONDUCTIVE LAYERS

Filed Oct. 20, 1965

United States Patent Office 3,397,084

Patented Aug. 13, 1968

3,397,084

METHOD FOR PRODUCING SUPERCONDUCTIVE LAYERS

Walter Krieglstein, Rosstal, Germany, assignor to Siemens Aktiengesellschaft, Erlangen, Germany, a corporation of Germany Filed Oct. 20, 1965, Ser. No. 498,238
Claims priority, application Germany, Dec. 12, 1964, S 94,596
13 Claims. (Cl. 117—217)

My invention relates to superconductive devices. More particularly, it relates to a method for producing superconducting layers on a carrier substrate.

Superconductive intermetallic compounds have found wide usage in many electrical applications where good superconducting properties are required. Thus, for example, the intermetallic compound niobium-tin ($Nb_3Sn$) posses a critical magnetic field exceeding 100 kilogauss at a temperature of about 0° K. The critical temperature of this intermetallic compound lies at about 18° K. The critical magnetic field of the intermetallic compound vanadium-gallium ($V_3Ga$) is even greater than that of the aforementioned niobium-tin since at a temperature of about 0° K., its critical magnetic field is between 300 and 400 kilogauss. The critical temperature of this vanadium-gallium compound is about 14.5° K. Many other intermetallic compounds have become known which are superconductive, examples of such compounds being niobium-aluminum ($Nb_3Al$), niobium-gallium ($Nb_3Ga$), niobium-indium ($Nb_3In$), vanadium-tin ($V_3Sn$), vanadium-silicon ($V_3Si$) and tantalum-tin ($Ta_3Sn$). The formulae, as set forth in the foregoing parentheses, indicate only the approximate chemical compositions of the respective compounds. In each compound, it is an intermetallic phase with the $\beta$-tungsten (A15) crystalline structure.

Since superconductive materials exhibit no ohmic resistance when they are in the superconductive state, they can be advantageously utilized as superconducting layers on wires or tapes for conducting electric currents or for providing coils for producing high magnetic fields. The layers of superconductive intermetallic compounds preferably should be as thin as is possible since such superconductive compounds are often quite brittle and, upon their deformation of their substrate carrier, may break or tear or otherwise lose important superconducting properties. By contrast, in thin layers, the superconductive compounds have relatively good deformability characteristics.

In a known method for producing wires or tapes with layers of superconductive intermetallic compounds thereon, a layer of the lower temperature melting component of the superconducting compound is deposited on a substrate which consists of the higher temperature melting component of the compound. For example, a layer of tin is deposited on a niobium wire. Thereafter, during an annealing of the layered wire at a temperature of about 1000° C., the lower temperature melting component, i.e., tin diffuses into the niobium substrate whereby a layer of the superconductive intermetallic compound niobium-tin is formed.

The foregoing method presents several disadvantages. Thus, during the annealing step, a large portion of the lower temperature melting component evaporates, and a further portion coalesces into globules because of the surface tension which results from the liquefaction of this component at the annealing temperature. Consequently, homogeneous superconductive layers of uniform thickness cannot, practicably, be achieved and the surfaces of layered wires and tapes produced by this method are relatively rough. In addition, to insure the diffusion of sufficient lower temperature melting component into the substrate despite the extensive evaporation, relatively high temperatures are required.

Accordingly, it is an important object of this invention to provide a method for providing a layer of a two component superconductive intermetallic compound on a substrate of the higher temperature melting component which is uniform in thickness and is homogeneous.

This object is achieved by depositing a layer of the lower temperature melting component of the compound to be produced on a substrate consisting of the higher temperature melting component and diffusing the deposited layer into the substrate at an elevated temperature. The inventive concept resides in the depositing of a cover layer of a metal whose melting point lies above the diffusion temperature required to produce the superconductive compound on the deposited layer of the lower teperature melting component, the cover layer metal also being one which does not tend to form a compound or alloy with the lower melting component at the aforesaid diffusion temperature to an extent which may obstruct the diffusion process. Also part of the inventive concept is the subjecting of the substrate to a heat treatment, either in a vacuum or in a protective gas atmosphere at which time the lower melting component diffuses into the higher melting component to form theretherewith a layer of the superconductive intermetallic compound.

The method of the invention is quite good for the production of uniform homogeneous superconducting layers of niobium tin and also is quite effective for producing layers of other intermetallic superconducting compounds such as, for example, the hereinabove mentioned niobium-aluminum, niobium-gallium, niobium-indium, vanadium-tin vanadium-gallium, vanadium-silicon, and tantalum-tin compounds.

It has been found that metals particularly well suited for forming the cover layer are silver, nickel, and chromium. Thus, in tests wherein a niobium tape was coated by a vapor deposition method with a layer of tin about 1$\mu$ thick and this tin layer was coated by a vapor deposition method with a layer, about 1$\mu$ in thickness, of silver nickel or chromium, and thereafter an annealing was carried out at about 900° C. for about an hour, there was substantially little or no reaction between the cover layer metal and the tin nor was there any alloying therebetween whereby the desired diffusion of the tin into the niobium tape was not prevented or impeded. On the contrary, it was found that the deposited cover layers, in fact, prevented the tin from evaporating and thus insured a satisfactory uniform diffusion thereof into the niobium.

The layer of the lower melting component of the superconductive intermetallic compound as well as the cover metal layer may be deposited on the higher melting component substrate by many methods, the important condition to be met by these methods being that homogeneous layers result therefrom. Suitable methods, for example, are electrolytic deposition or vapor deposition under vacuum conditions.

The vapor deposition method carried out in a vacuum has been found to be particularly advantageous where the inventive method is to be employed for producing layers of superconductive intermetallic compounds on tape substrates since, by coating these tapes by a vapor deposition step in a vacuum, such coating can be effected in a continuous operation in a simple manner. The coating by vapor deposition can be carried out in known and commercially available vapor-coating apparatus.

The heat treatment to effect the diffusion to form the superconductive intermetallic compound is advantageously carried out in a continuous-heating oven adjacent the vapor-coating apparatus. The heat treatment should be carried out in a vacuum or in a protective gas atmosphere since, otherwise, the metals of the cover layer may tend to scale at the annealing temperatures which are employed.

In addition to producing superconductive tapes, the method according to the invention is suitable for the production of wires and other type structural elements having superconductive layers thereon, examples of the latter being for example, superconductive integrated circuits, switching circuits, coil bodies upon which the superconductive layers are deposited directly, and the like. Where the physical geometry of the substrate does not permit the satisfactory deposition of layers thereon by vapor deposition, the layers can then advantageously be deposited thereon electrolytically.

The temperature which is employed in the heat treatment to obtain the layer resulting from the diffusion is chosen in accordance with the intermetallic compound to be formed. Thus, a niobium-tin layer forms at about 900° C., and niobium-aluminum layer forms at a temperature of about 1000° C. Generally, the coated substrates have to be subjected to a temperature of between 900 and 1500° C. for a period of from about a few minutes to several hours. The thickness of the diffusion, i.e., the intermetallic compound layers, increases with an increasing temperature and with an increasing length of the heat treatment period. The temperatures employed in the heat treatment must, in any case, be less than the melting point of the higher melting component of the superconducting compound being produced and must also be less than the metal comprising the cover layer. In addition these employed temperatures have to be less than the boiling point of the lower melting component of the superconducting compound. Thus, for example, silver could not be the cover metal at annealing temperatures above 960° C. since it melts at 961° C. It has been found through appropriate tests that temperatures required for the production of satisfactory intermetallic compound layers resulting from diffusion and in accordance with the inventive method are slightly lower than those required for effecting diffusion in the absence of a metallic cover layer.

Generally speaking and in accordance with the invention, there is provided a method for producing a layer of a two-component superconductive intermetallic compound on a substrate structure comprising the higher melting component of the compound. The method comprises the steps of depositing a layer of the lower melting component of the compound on the substrate, depositing a layer of a metal on the lower melting component, the last named metal having a melting point which is higher than the diffusion temperature which is necessary to form the intermetallic compound from the two components and which does not tend to alloy with or form a compound with the lower melting component at the diffusion temperature, and then heating the coated substrate structure in a vacuum or a protective gas atmosphere at a temperature in which the lower melting component diffuses into the substrate component to form the aforesaid intermetallic compound layer on the substrate.

The foregoing and more specific objects of my invention will be apparent from and will be mentioned in the following description of a method producing superconductive layers according to the invention taken in conjunction with the accompanying drawing.

The following examples are illustrated embodiments of the method according to the invention. It is to be understood that these embodiments are set forth by way of example and it is not intended to limit the invention thereto.

Example 1

Figure 1:
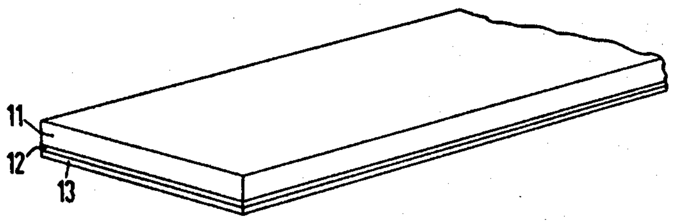
FIG. 1 is a three-dimensional depiction of a tape substrate structure comprising a higher melting component of a superconductive intermetallic compond having thereon a layer of the lower melting component, a cover layer lying on the lower melting component layer.

In this example, the production of a superconductive-niobium tin layer on a tape is described in conjunction with reference to FIG. 1.

As shown in FIG. 1, a niobium tape 11 which suitably may have a thickness of 30$\mu$ and a width of about 3 mm. was first coated with a tin layer 12, such coating being effected in a known, commercially available vacuum vapor deposition apparatus at a vacuum of between about $10^{-6}$ and $5\times10^{-6}$ torr, layer 12, having a thickness of about 10$\mu$. The tin in the vapor deposition apparatus was brought to a temperature of about 1000° C. in a tungsten boat which was heated by an electrical current passing therethrough. The vapor pressure of tin at this 1000° C. temperature at the aforesaid vacuum is sufficient to achieve a vapor deposition tin coating of the niobium tape, the distance chosen between the tungsten boat and the niobium tape being about 7 cm. Such a latter distance was chosen to permit a slight cooling of the tin vapor on its way to the niobium tape and in order to avoid the heating of the niobium tape by heat radiation from the molten tin to the extent where a premature diffusion of the tin into the niobium might take place during the tin layer vapor deposition step. Such premature diffusion has to be avoided as much as possible if a homogeneous layer is to be produced.

In a second vapor deposition coating step, a layer 13 of silver having a thickness of about 1$\mu$ was vapor deposited on tin layer 12. Such deposition was achieved by heating the silver in an electrically heated tungsten boat as described hereinabove at a temperature of about 1050° C. The two-layer substrate tape was then heated in an evacuated vessel at a temperature of about 900° C. for about one hour. During this heating, the tin diffused into the niobium to form with the niobium a homogeneous layer of the intermetallic compound niobium-tin. The finished layered tape had the very high critical temperature of about 17° K. Its jump from the superconducting to the normally conducting state was quite abrupt, thereby indicating that the intermetallic superconductive layer was quite satisfactorily homogeneous.

Example 2

Employing the method according to the invention, a niobium tape was coated with a 1$\mu$ thick layer of tin by vapor deposition as described in Example 1. In the second vapor deposition step, a nickel layer of about a thickness of 1$\mu$ was deposited on this tin layer by heating the nickel to a temperature of about 1500° C. in a tungsten spiral through which an electric current was passed. The two layer coated niobium tape was then heated at about 900° C. for about one hour. The resulting finished tape had a critical temperature of about 17.7° K.

Example 3

A niobium tape such as tape 11 in FIG. 1 was coated with a 1$\mu$ thick layer of tin as described in Examples 1 and 2. In a second vapor deposition coating step, a 1$\mu$ thick layer of chromium was deposited on the tin layer by heating the chromium to a temperature slightly above 1200° C. in a tungsten boat through which a current was passed. The chromium whose melting point lies at about 1800° C. is still solid at the 1200° C. temperature. However, at the vacuum of from $10^{-6}$ to $5\times10^{-6}$ torr present in the vapor deposition apparatus, sufficient chromium vapor sublimated from the solid chromium to effect a satisfactory vapor-deposition thereof on the tin layer. After the chromium layer deposition on the tin layer, the two-layered tape was heated at 1000° C. for about 90 minutes. The resulting tape had a critical temperature of about 17° K.

In a manner similar to the foregoing examples, layers of gallium, aluminum, indium or silicon can be vapor deposited on tapes of niobium, tantalum or vanadium. In the aforementioned vacuum of $10^{-6}$ to $5\times10^{-6}$ torr, to effect vapor deposition, gallium is heated to a temperature of about 1200° C., aluminum is heated to a temperature of about 1150° C., indium is heated to a temperature of about 1200° C., and silicon is heated to a temperature of about 1500° C. The vapor deposition of the metallic cover layer and the subsequent heating of the two-layered tape is effected in the manner described in the aforesaid examples.

Example 4

Figure 2:
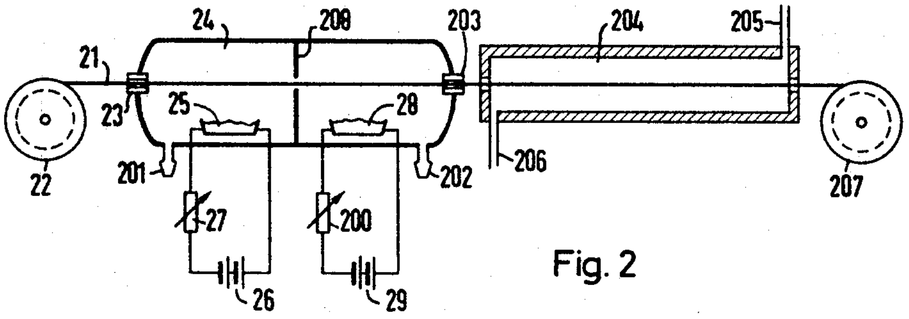
FIG. 2 is a schematic depiction, partly in section of an arrangement for continuously producing tapes with a superconductive intermetallic compound layer thereon according to the method of the invention.

In this example, there is described the continuous production of a tape with a superconductive niobium-tin layer thereon and a cover layer of silver employing the arrangement shown in FIG. 2.

In this continuous production, the niobium tape 21 wound on a coil 22 is unwound therefrom and passed through a vacuum-tight entrance sleeve 23 and fed into a vapor deposition vessel 24 wherein, first, a tin layer is vapor-deposited on the niobium. The tin melt is contained in a tungsten boat 25 which is connected in series circuit with a variable resistor 27 and a current supply source 26, resistor 27 enabling the regulation of the heating current supplied to boat 25 having the tin melt therein. The tin-layered niobium tape is then coated with silver which is vapor-deposited on the tin layer from the silver melt contained in a tungsten boat 28, boat 28 and the silver melt therein being supplied with heating current from a supply source 29 which may be regulated by a variable resistor 200. Numerals 201 and 202 designate pipe sockets which adapt vessel 24 for connection to a vacuum pump or other suitable evacuation apparatus. The two-layered niobium tape is passed through a vacuum tight egress sleeve from vessel 24 and is fed into a tubular oven 204 adjacent to vessel 24. Numerals 205 and 206 designate inlet pipes into oven 204 for adapting it to have a protective gas such as helium or argon introduced thereinto. The rate of tape movement, the rate of metal vapor deposition and the length of the oven are all suitably chosen whereby satisfactory coatings on and heat treatment of the continuously moving tape is achieved. The finished tape emerging from oven 204 is wound on a motor driven reel 207. The numeral 208 designates a diaphram which functions to divide vessel 24 into two vapor deposition compartments.

In the place of metal melts in boats for effecting vapor deposition of metal layers, rods of the appropriate metal may be used. In such use, one end of a rod is melted suitably by high frequency or resistance heating. Such rods may be respectively fed into the compartments of vessel 24 from the exterior thereof at a rate corresponding to the amount of metal to be evaporated in a given time period.

Example 5

In accordance with the method of the invention, structural elements other than tapes such as wires, integrated circuits, and coils can be coated with the superior superconductive intermetallic compounds.

Figure 3:
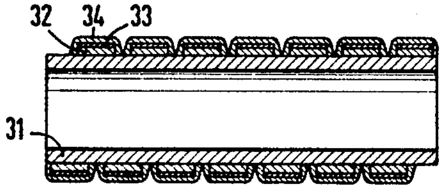
FIG. 3 shows in longitudinal section, a coil body having a superconductive intermetallic compound layer produced thereon by the method of the invention.

In FIG. 3, there is shown in longitudinal cross section, a coil body coated in accordance with the inventive method. In this figure, on a ceramic tube 31, there was first applied a coil shaped substrate 32 consisting of niobium, a layer of tin 33 being deposited on the niobium. Both the niobium and the tin layers were applied by a suitable method such as vapor deposition or spray deposition. Thereafter, a layer of silver 34 was deposited on the tin layer, also suitably by a vapor deposition technique. During the heating which is necessary to cause the production of the superconductive intermetallic compound layer, the cover layer of silver prevents an undesired coalescence resulting from diffusion of the closely juxtaposed tape-shaped niobium and tin which results in a short-circuiting between the superconductive coil windings.

With the method according to the invention, substrate materials can be deposited on all sides of a structural element. However, precisely for the production of superconductive tapes, the unilateral vapor deposition method, as described in Examples 1 to 4, is of particular advantage. This is because unilaterally vapor-deposited layered tapes can in their further processing, as windings of coils, for example, be deformed such that they are only under pressure but not under tension. Consequently, fissures in or scaling of the superconductive layer from the substrate does not occur.

The vapor-deposited cover layer, if it consists of a highly conductive material such as silver, for example, can also serve to assume the current conducting function when the superconductive layer is normally conducting, thereby preventing the impairment or destruction of the superconductive layer from overheating.

It will be obvious to those skilled in the art upon stydying this disclosure that methods for producing superconductive layers according to my invention permit of a great variety of modifications and hence can be given embodiments other than those particularly illustrated herein without departing from the essential features of my invention and within the scope of the claims annexed hereto.

I claim:

1. A method for producing a layer of a two-component superconductive intermetallic compound on a substrate structure comprising the higher melting component of said compound which comprises the steps of depositing a layer of the lower melting component of said compound on said substrate, depositing a layer of a cover metal on said lower melting component, said last named metal having a melting point which is higher than the diffusion temperature necessary to form said intermetallic compound from said two components and which does not tend to alloy with or form a compound with said lower melting component at said diffusion temperature, and heating said coated substrate structure at a temperature under inert conditions in which said lower melting component diffuses into said substrate component to form said intermetallic compound layer on said substrate.

2. A method as defined in claim 1 wherein said inert conditions are a vacuum.

3. A method as defined in claim 1 wherein said inert conditions are a protective gas atmosphere.

4. A method as defined in claim 1 wherein said higher melting component is selected from the group consisting of niobium, vanadium and tantalum, wherein said lower melting component is selected from the group consisting of tin, aluminum, gallium, indium and silicon, and wherein said cover metal is selected from the group consisting of silver, nickel and chromium.

5. A method as defined in claim 1 wherein said lower melting component layer and said cover metal layer are deposited by vapor deposition.

6. A method as defined in claim 1 wherein said higher melting component is niobium, wherein said lower melting component is tin, and wherein said cover metal is silver.

7. A method as defined in claim 1 wherein said heating is carried out at a temperature of about 900° C.

8. A method as defined in claim 1 wherein said heating is carried out at a temperature of about 900 to 1500° C.

9. A method as defined in claim 1 wherein said higher melting component is niobium, wherein said lower melting component is tin, and whereby said cover metal is nickel.

10. A method as defined in claim 1 wherein said higher melting component is niobium, wherein said lower melting component is tin, and wherein said cover metal is chromium.

11. A method as defined in claim 9 wherein said heating is carried out at a temperature of about 900° C.

12. A method as defined in claim 10 wherein said heating is carried out at a temperature of about 1000° C.

13. A method for continuously producing a layer of a two-component superconductive intermetallic compound on a tape substrate comprising the higher melting component of said compound comprising continuously feeding said tape into an evacuated vapor deposition chamber having a first compartment in the proximal portion of the path of said tape having therein a container of the lower melting component of said compound which is heated to a temperature sufficient to vaporize said lower melting component whereby a layer of said last named component is vapor deposited on said tape, said chamber having a second compartment distal to said first compartment in the path of said tape, said second compartment having therein a container of a cover metal which is heated to a temperature sufficient to vaporize said cover metal and to vapor deposit a layer of said cover metal on said lower-melting component layer, and passing said two layered tape into an oven having an inert atmosphere to heat said two layered tape during its passage through said oven to a temperature sufficient to cause a diffusion of said lower melting component into said substrate higher melting component to form said intermetallic compound layer on said substrate.

References Cited

UNITED STATES PATENTS

| | | | |
|---|---|---|---|
| 3,262,187 | 7/1966 | Allen et al. | 338—32 |
| 3,293,008 | 12/1966 | Allen et al. | 117—227 X |
| 3,327,370 | 6/1967 | Cohen | 117—217 X |

ALFRED L. LEAVITT, *Primary Examiner.*

A. GOLIAN, *Assistant Examiner.*